United States Patent
Choi

(10) Patent No.: US 8,624,247 B2
(45) Date of Patent: Jan. 7, 2014

(54) ORGANIC LIGHT EMITTING DIODE DISPLAY AND MANUFACTURING METHOD THEREOF

(75) Inventor: Jung-Mi Choi, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 192 days.

(21) Appl. No.: 13/064,271

(22) Filed: Mar. 15, 2011

(65) Prior Publication Data

US 2012/0007107 A1 Jan. 12, 2012

(30) Foreign Application Priority Data

Jul. 7, 2010 (KR) .................. 10-2010-0065571

(51) Int. Cl.
*H01L 29/04* (2006.01)
(52) U.S. Cl.
USPC ............ 257/59; 257/88; 257/95; 257/E33.001
(58) Field of Classification Search
CPC .................................................. H01L 25/0753
USPC ........... 257/28, 29, 69, 82, 92, 40, 59, 72, 88,
257/94–103, 258, 291, 390, 443, 642, 643,
257/759, E33.001, E51.005, E51.002,
257/E25.008, E25.009, E33.059, E21.503,
257/79
See application file for complete search history.

(56) References Cited

U.S. PATENT DOCUMENTS

| | | | | |
|---|---|---|---|---|
| 4,357,557 A | * | 11/1982 | Inohara et al. | 313/509 |
| 5,189,405 A | * | 2/1993 | Yamashita et al. | 313/512 |
| 7,486,017 B2 | * | 2/2009 | Ohkubo | 313/506 |
| 7,534,635 B1 | * | 5/2009 | Foust et al. | 438/25 |
| 2004/0046184 A1 | * | 3/2004 | Yanagawa et al. | 257/200 |
| 2007/0114542 A1 | * | 5/2007 | Yamazaki et al. | 257/79 |
| 2009/0231661 A1 | * | 9/2009 | Patry et al. | 359/267 |

FOREIGN PATENT DOCUMENTS

| | | |
|---|---|---|
| JP | 2004-079432 A | 3/2004 |
| KR | 10 2009-0116199 A | 11/2009 |
| KR | 10 2010-0032703 A | 3/2010 |

* cited by examiner

*Primary Examiner* — Cuong Q Nguyen
*Assistant Examiner* — Yosef Gebreyesus
(74) *Attorney, Agent, or Firm* — Lee & Morse, P.C.

(57) ABSTRACT

An organic light emitting diode (OLED) display includes: a first substrate; a display portion that is formed on the first substrate and includes a driving circuit portion and an organic light emitting diode; a thin film encapsulation layer that covers the display portion; an adhesive layer that covers an upper surface and a side of the thin film encapsulation layer; an absorption functional layer that is formed on the adhesive layer and absorbs at least one of oxygen and moisture; and a second substrate that is formed on the absorption functional layer.

17 Claims, 7 Drawing Sheets

ORGANIC LIGHT EMITTING DIODE DISPLAY AND MANUFACTURING METHOD THEREOF

BACKGROUND

1. Field

The described technology relates generally to an organic light emitting diode (OLED) display, and more particularly, to an organic light emitting diode (OLED) display to which a thin film encapsulation (TFE) technology is applied and a manufacturing method thereof.

2. Description of the Related Art

An organic light emitting diode (OLED) display is a self light emitting display that is provided with an organic light emitting diode that emits light to display an image. An organic light emitting diode may deteriorate due to penetration of external moisture, oxygen and ultraviolet (UV) radiation.

The above information disclosed in this Background section is only for enhancement of understanding of the background of the described technology and therefore it may contain information that does not form the prior art that is already known in this country to a person of ordinary skill in the art.

SUMMARY

An exemplary embodiment provides an organic light emitting diode (OLED) display that includes a first substrate, a display portion on the first substrate and including a driving circuit portion and an organic light emitting diode, a thin film encapsulation layer that covers the display portion, an adhesive layer that covers an upper surface and a side of the thin film encapsulation layer, an absorption functional layer on the adhesive layer, the absorption functional layer absorbing at least one of oxygen and moisture, and a second substrate on the absorption functional layer.

The first substrate and the second substrate may be made of a flexible polymer film. The first substrate may be a transparent polymer film. The organic light emitting diode (OLED) display may further include a barrier layer between the first substrate and the display portion.

The absorption functional layer may include at least one of a metal and a metal oxide. The absorption functional layer may be formed on one side of the second substrate by sputtering. The absorption functional layer may include at least one of titanium, titanium alloy, titanium oxide, potassium, potassium oxide, magnesium, magnesium oxide, barium and barium oxide. The absorption functional layer may have a smaller area than the adhesive layer. The adhesive layer may cover the side of the absorption functional layer.

The organic light emitting diode (OLED) display may further include an insulation pattern layer between the absorption functional layer and the second substrate. The insulation pattern layer may include at least one opening at a portion of the insulation pattern layer that is adjacent to the edge of the second substrate. The absorption functional layer may contact the second substrate through the opening.

Another exemplary embodiment provides a method for manufacturing an organic light emitting diode (OLED) display that includes forming a first substrate on a first support plate, sequentially forming a display portion that includes a driving circuit portion and an organic light emitting diode and a thin film encapsulation layer that covers the display portion on the first substrate, forming a second substrate on a second support plate, sequentially forming an absorption functional layer and an adhesive layer on the second substrate, aligning and disposing the first support plate and the second support plate so that the adhesive layer and the thin film encapsulation layer face each other, attaching the first support plate and the second support plate to each other so that the adhesive layer contacts the thin film encapsulation layer, and separating the first support plate from the first substrate and separating the second support plate from the second substrate.

The first substrate may be formed by coating a polymer resin on the first support plate, and the second substrate may be formed by coating a polymer resin on the second support plate. The method for manufacturing an organic light emitting diode (OLED) display may further include forming a barrier layer on the first substrate before forming the display portion on the first substrate.

The absorption functional layer may include at least one of a metal and a metal oxide, and may be formed on the second substrate by sputtering. The absorption functional layer may include at least one of titanium, titanium alloy, titanium oxide, potassium, potassium oxide, magnesium, magnesium oxide, barium and barium oxide.

The adhesive layer may have a larger area than the absorption functional layer and may cover an upper portion and a side of the absorption functional layer. The adhesive layer may be larger than the thin film encapsulation layer and may cover an upper portion and a side of the thin film encapsulation layer.

The method for manufacturing an organic light emitting diode (OLED) display may further include forming an insulation pattern layer on the second substrate before forming the absorption functional layer on the second substrate. The insulation pattern layer may include at least one opening at a portion of the insulation pattern layer that is adjacent to the edge of the second substrate, and the absorption functional layer may contact the second substrate through the opening.

According to the exemplary embodiments, the organic light emitting diode (OLED) display may minimize an increase of dead space and improve a sealing function of the driving circuit portion and the organic light emitting diode by using the thin film encapsulation layer and adhesive layer and absorption functional layer. As a result, a use life-span may be increased and a deterioration of the organic light emitting diode may be minimized.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
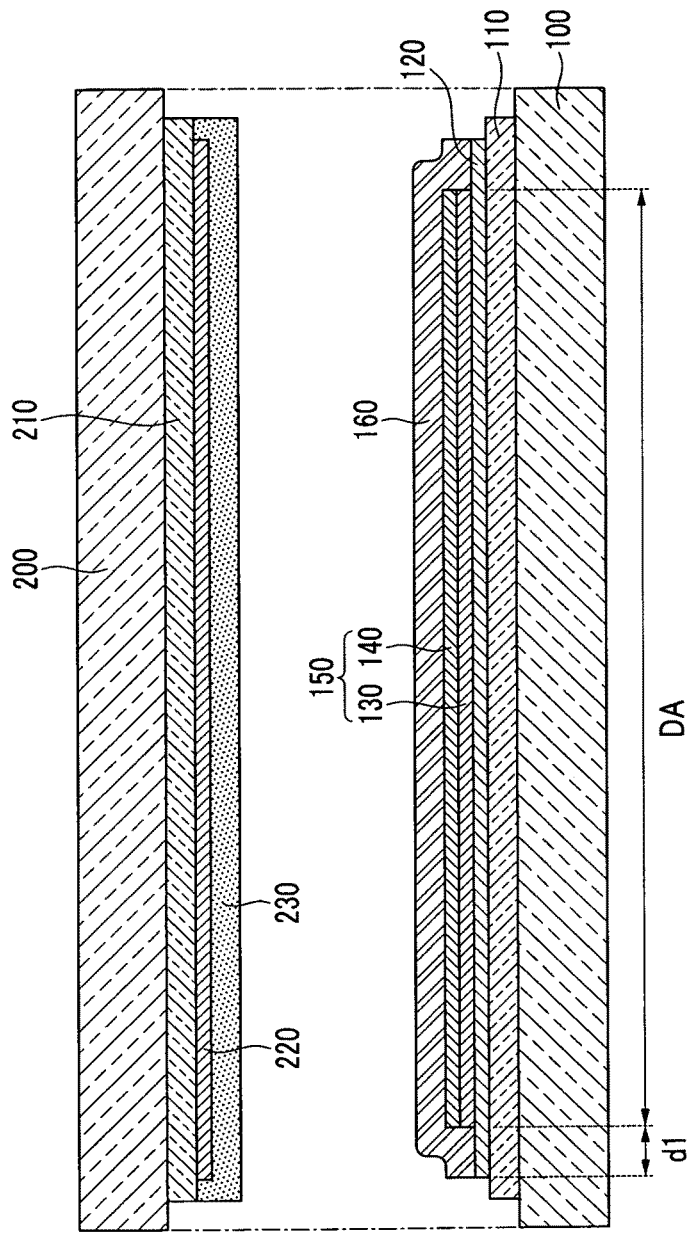
FIG. 1 to FIG. 3 illustrate process views relating to a manufacturing method of an organic light emitting diode (OLED) display according to an exemplary embodiment.

Korean Patent Application No. 10-2010-0065571, filed on Jul. 7, 2010, in the Korean Intellectual Property Office, and entitled: "Organic Light Emitting Diode Display and Manufacturing Method Thereof," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
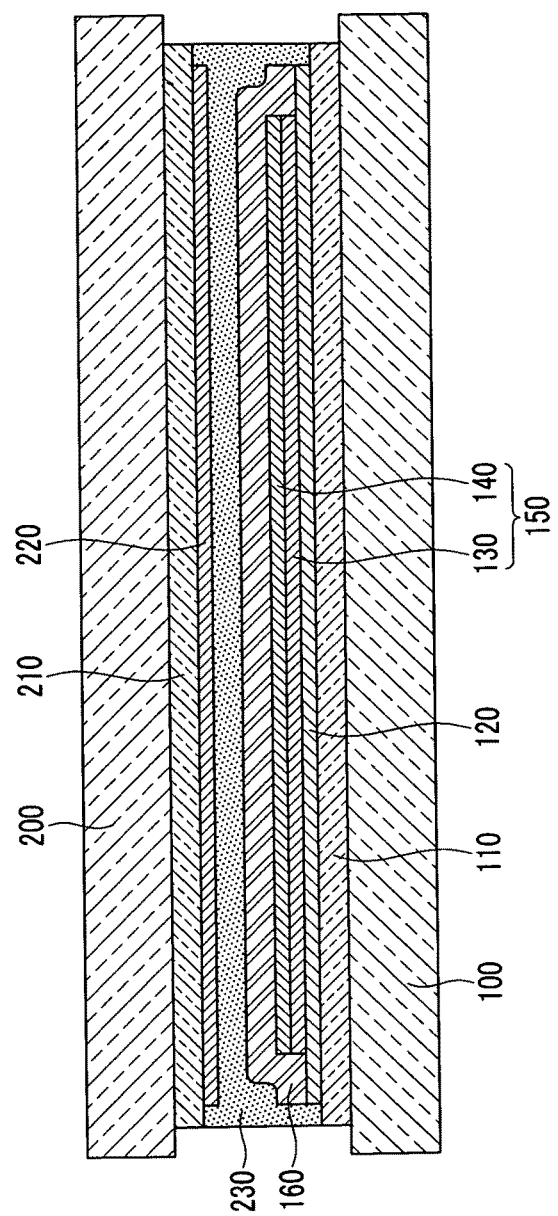
Figure 3:
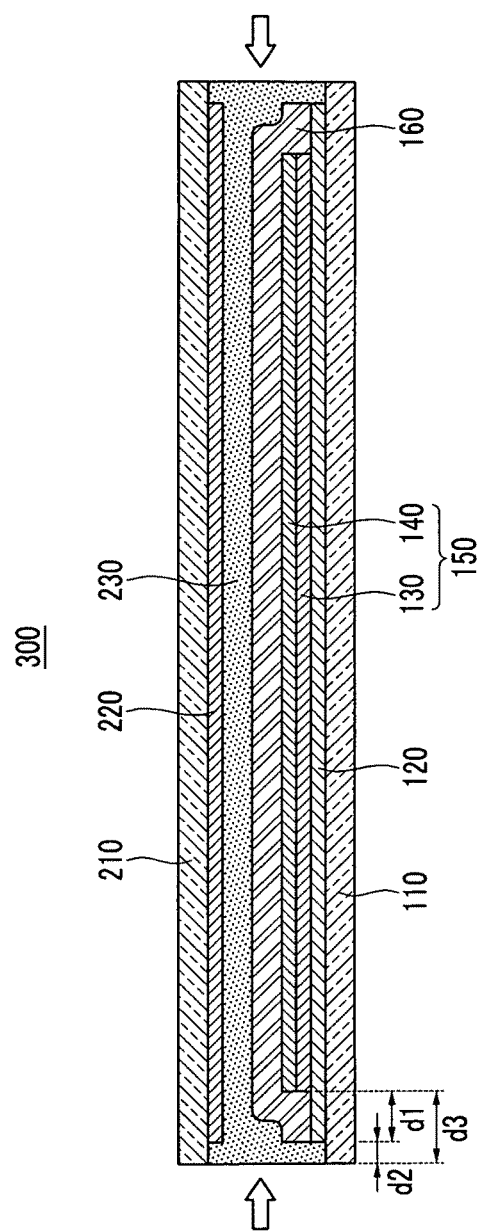

FIG. 1 to FIG. 3 illustrate process views relating to a manufacturing method of an organic light emitting diode (OLED) display according to an exemplary embodiment.

Referring to FIG. 1, a first substrate 110 is disposed on a first support plate 100. The first substrate 110 may be a flexible transparent polymer film. The first support plate 100 supports the first substrate 110 in the manufacturing process, as features of the organic light emitting diode are formed on the first substrate 110. When manufacturing of the organic light emitting diode is completed, the first support plate 100 is separated from the first substrate 110.

The first support plate 100 may be made of glass. The first substrate 110 may be formed on the first support plate 100 to a predetermined thickness by screen printing a transparent polymer resin onto the first support plate 100. The first substrate 110 may also be formed of other materials and by methods other than screen printing.

A barrier layer 120, a driving circuit portion 130 and an organic light emitting diode 140 may be sequentially formed on the first substrate 110. The area of the first substrate 110 in which the driving circuit portion 130 and the organic light emitting diode 140 are formed may be referred to as the display area DA. The barrier layer 120 may be formed in an area that is larger than the display area DA. The driving circuit portion 130 and the organic light emitting diode 140 may be collectively referred to as the display portion 150. In FIG. 1, for convenience of description, the driving circuit portion 130 and the organic light emitting diode 140 are each schematically illustrated as a single layer.

The barrier layer 120 may prevent an impurity from migrating from the first substrate 110 to the driving circuit portion 130 and the organic light emitting diode 140. The barrier layer 120 may be formed of a silicon oxide film, a silicon nitride film or a layered film of silicon oxide and silicon nitride films.

The display portion 150 may include a plurality of pixels. The driving circuit portion 130 and the organic light emitting diode 140 may be disposed with respect to each pixel. The pixel may be formed of one sub pixel or a plurality of sub pixels, a pixel being a minimum unit that displays an image. A non-display area that includes a sealing area, a wiring area and a pad area may be disposed at the external side of the display portion 150.

The driving circuit portion 130 may include at least two thin film transistors (a switching thin film transistor and a driving thin film transistor) and at least one capacitor. The organic light emitting diode 140 may includes a pixel electrode, an organic emission layer and a common electrode (see, for example, the discussion below relating to the driving circuit and organic light emitting diode illustrated in FIGS. 5 and 6). A pixel electrode may be formed for each pixel individually, and may be electrically connected to the thin film transistor of the corresponding pixel. The common electrode may be formed commonly over a plurality of pixels.

In the display portion 150, various organic layers in addition to the organic emission layer may be disposed. Characteristics of such organic layers may deteriorate if the organic layers were to be combined with moisture or oxygen. Accordingly, a thin film encapsulation layer 160 may be disposed on the driving circuit portion 130 and organic light emitting diode 140. The thin film encapsulation layer 160 may be formed to have an area that is larger than the area of the display portion 150 of the first substrate 110, and may cover and protect upper surfaces and sides of the driving circuit portion 130 and the organic light emitting diode 140.

The thin film encapsulation layer 160 may be formed as a layered structure of that includes at least one inorganic film and at least one organic film. The inorganic film may be aluminum oxide or silicon oxide, and the organic film may be at least one of epoxy, acrylate and urethane acrylate. The inorganic film may suppress the penetration of moisture and oxygen from the outside toward the organic light emitting diode 140. The organic film may compensate for internal stress of the inorganic film or may fill fine cracks or pinholes of the inorganic film.

In FIG. 1, the width of the portion the thin film encapsulation layer 160 that is disposed at the outside of the organic light emitting diode 140 and that contacts the non-display area of the first substrate 110 is represented by the first width d1.

Subsequently, a second substrate 210 may be formed on a second support plate 200. The second substrate 210 may be a flexible transparent polymer film. The second support plate 200, in the manufacturing process, may support the second substrate 210 as additional components are formed on the second substrate 210. In the final process, the second support plate 200 may be separated from the second substrate 210.

The second support plate 200 may be a transparent glass substrate. The second substrate 210 may be formed to a predetermined thickness by screen printing a polymer resin on the second support plate 200. The second substrate 210 may also be formed by methods other than screen printing. The second substrate 210 may have the same size as the first substrate 110. The area of the second substrate 210 and the area of the first substrate 110 facing each other may be equal.

An absorption functional layer 220 may be formed on the second substrate 210. The absorption functional layer 220 may include a metal or a metal oxide that has an absorption function with respect to at least one of moisture and oxygen. The absorption functional layer 220 may include at least one of titanium, titanium alloy, titanium oxide, potassium, potassium oxide, magnesium, magnesium oxide, barium and barium oxide. The absorption functional layer 220 may be formed on the second substrate 210 by a sputtering process. The thickness of the absorption functional layer 220 may be approximately 10 µm to 100 µm.

The absorption functional layer 220 may be formed to have an area that is smaller than that of the second substrate 210. The edge of the second substrate 210 having the absorption functional layer 220 formed thereon may be exposed. In addition, an adhesive layer 230 may formed on the absorption functional layer 220. The adhesive layer 230 may be formed to have an area that is larger than that of the absorption functional layer 220. For example, the area of the adhesive layer 230 may be the same as that of the second substrate 210. The adhesive layer 230 may contact a portion of the second substrate 210 and cover an upper surface and an entire side of the absorption functional layer 220. In addition, the adhesive layer 230 may have an area that is larger than that of the thin film encapsulation layer 160. The adhesive layer 230 may include an epoxy-based material.

The sputtering process to form the absorption functional layer 220 may be performed at a high temperature of about 300° C. If the absorption functional layer 220 were to be formed on the first substrate 110 instead of on the second substrate 210, for example, on the thin film encapsulation layer 160, in the sputtering process to form the absorption functional layer 220, the driving circuit portion 130 and the organic light emitting diode 140 might be damaged by the high temperature. Accordingly, it might be impossible to form the absorption functional layer 220 on the first substrate 110 by the sputtering process. However, in the exemplary embodiment, since the absorption functional layer 220 may be formed on the second substrate 210 instead of the first substrate 110 by the sputtering process, damage to the driving circuit portion 130 and the organic light emitting diode 140 may be avoided. The absorption functional layer 220 may also be formed by methods other than sputtering, and any high temperature process may be feasible in the range of temperatures that can be tolerated by the second substrate 210.

Referring to FIG. 1 and FIG. 2, the second support plate 200 may be aligned and disposed on the first support plate 100 so that the thin film encapsulation layer 160 faces the adhesive layer 230. Subsequently, the two support plates 100 and 200 may be attached to each other by lowering the second support plate 200 so that the thin film encapsulation layer 160 contacts the adhesive layer 230. If the adhesive layer 230 is formed on the second substrate 210 to have an area that is larger than the area of the thin film encapsulation layer 160, the adhesive layer 230 may cover an upper surface and an entire side of the thin film encapsulation layer 160.

The adhesive layer 230 may contact the edge of the barrier layer 120 or the edge of the first substrate 110. FIG. 2 illustrates an example where the barrier layer 120 is formed to have an area that is smaller than the area the first substrate 110 and where the adhesive layer 230 contacts the edge of the first substrate 110.

Referring to FIG. 2 and FIG. 3, the first support plate 100 and the second support plate 200 may be separated from the first substrate 110 and the second substrate 210, respectively. For example, the first support plate 100 and the second support plate 200 may be separated from the first substrate 110 and the second substrate 210, respectively, by using a laser. Thereby, the organic light emitting diode (OLED) display 300 of the first exemplary embodiment may be completed. The completed organic light emitting diode (OLED) display 300 may be an ultra thin type. If the first substrate 110 and the second substrate 210 are formed of a flexible polymer film, a flexible organic light emitting diode (OLED) display may be provided.

In the completed organic light emitting diode (OLED) display 300, the barrier layer 120, the driving circuit portion 130, the organic light emitting diode 140, the thin film encapsulation layer 160, the adhesive layer 230, the absorption functional layer 220 and the second substrate 210 are sequentially disposed on the first substrate 110. In addition, the adhesive layer 230 may be formed to have an area that is larger than the area of the thin film encapsulation layer 160, and may cover and protect an upper surface and an entire side of the thin film encapsulation layer 160.

Accordingly, the driving circuit portion 130 and the organic light emitting diode 140 may be surrounded by the thin film encapsulation layer 160 and may be protected by the absorption functional layer 220. In addition, if the adhesive layer 230 covers an upper surface and an entire side of the thin film encapsulation layer 160, the thin film encapsulation layer 160 is not exposed to the outside. The adhesive layer 230 may be disposed at the outermost portion between the first substrate 110 and the second substrate 210.

The adhesive layer 230 may attach the first substrate 110 and the second substrate 210 to each other. The adhesive layer 230 may increase a penetration path of moisture and oxygen, and thereby delay the penetration time of moisture and oxygen into the display. If the adhesive layer 230 is disposed at the outermost portion between the first substrate 110 and the second substrate 210, the moisture and oxygen that penetrate in a surface direction (arrow direction of FIG. 3) at the side of the organic light emitting diode (OLED) display 300 do not flow into the thin film encapsulation layer 160 but flow into the adhesive layer 230.

If the absorption functional layer 220 is disposed directly on the adhesive layer 230, the absorption functional layer 220 may first absorb the moisture and oxygen that flow into the adhesive layer 230, thus suppressing the penetration of the moisture and oxygen into the thin film encapsulation layer 160. Because of the function of the adhesive layer 230 and absorption functional layer 220, the disadvantages of thin film encapsulation layer 160, which may be ineffective to suppress the penetration of moisture and oxygen in the surface direction, may be overcome.

The moisture and oxygen that penetrate in a thickness direction may be primarily blocked by the absorption functional layer 220, and secondarily blocked by the thin film encapsulation layer 160. Deterioration of the driving circuit portion 130 and the organic light emitting diode 140 may be avoided.

As described above, the organic light emitting diode (OLED) display 300 of the exemplary embodiment may improve a sealing function of the display portion 150 by compensating for ineffectiveness of the thin film encapsulation layer 160 by using the adhesive layer 230 and the absorption functional layer 220. As a result, a useful life-span of the organic light emitting diode (OLED) display 300 may be increased and a problem of display defects that are caused by deterioration of pixels may be solved or reduced.

In addition, since the organic light emitting diode (OLED) display 300 of the exemplary embodiment does not require a large increase of the width (the first width) (d1, see FIG. 1) of the portion that contacts the non-display area in the thin film encapsulation layer 160 in order to compensate for the ineffectiveness of the thin film encapsulation layer 160, an enlargement of dead space at outer edges of the display 300 may be minimized. Since the penetration path of the moisture and oxygen may be increased by forming the adhesive layer 230 instead of largely increasing the first width d1, an enlargement of the dead space may be minimized. (In FIG. 3, the width of the non-display area that is the dead space is represented by d3. The d3 is set by adding the first width d1 of the thin film encapsulation layer 160 and the width (the second width) d2 of the adhesive layer 230 outside the thin film encapsulation layer 160.)

Figure 4:
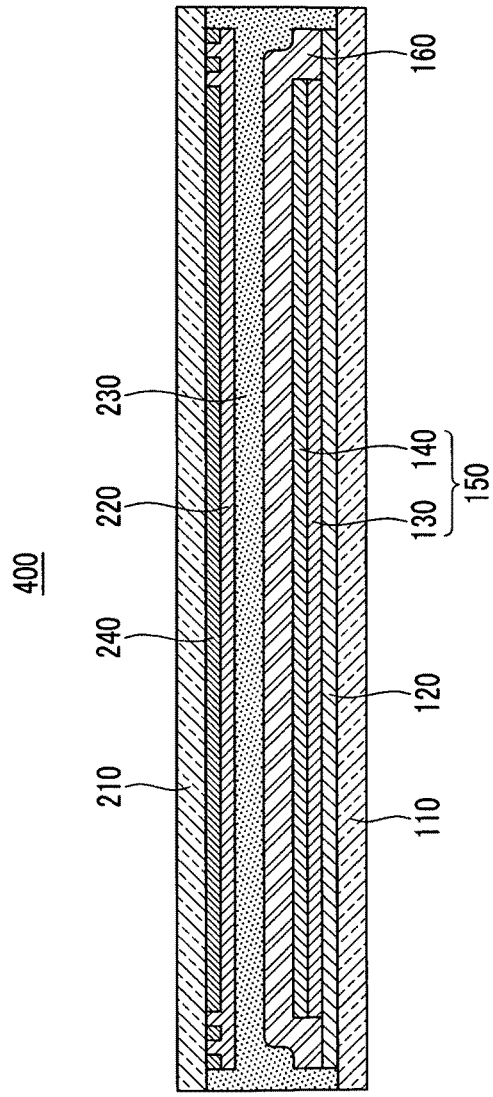
FIG. 4 illustrates a cross-sectional view of an organic light emitting diode (OLED) display according to another exemplary embodiment.

FIG. 4 illustrates a cross-sectional view of an organic light emitting diode (OLED) display according to another exemplary embodiment.

Referring to FIG. 4, the organic light emitting diode (OLED) display 400 may have the same configuration as the organic light emitting diode (OLED) display of FIGS. 1 to 3, except that an insulation pattern layer 240 is disposed between the second substrate 210 and the absorption functional layer 220. The same reference numerals may be used with respect to the corresponding same member in the exemplary embodiment of FIGS. 1 to 3.

In addition, the organic light emitting diode (OLED) display 400 of exemplary embodiment of FIG. 4 may be manufactured by the same method as the exemplary embodiment of FIGS. 1 to 3, except that forming the insulation pattern layer 240 may be carried out after forming the second substrate 210 and before forming the absorption functional layer 220.

The insulation pattern layer 240 may be made of the same polymer resin as the second substrate 210, and may be formed by a screen printing method. The insulation pattern layer 240 may include at least one opening at a portion of the insulation pattern layer that is adjacent to the edge of the second substrate 210. The absorption functional layer 220 may contact the second substrate 210 through the opening. That is, since the absorption functional layer 220 that is formed on the insulation pattern layer 240 may fill the opening of the insulation pattern layer 240, with the absorption functional layer 220 may contact the second substrate 210 through the opening.

The insulation pattern layer 240 may delay the penetration time of moisture and oxygen by further increasing the penetration path of the moisture and oxygen in addition to the delay that may be provided by the adhesive layer 230. Accordingly, the organic light emitting diode (OLED) display 400 of the exemplary embodiment of FIG. 4 may further delay the penetration time of moisture and oxygen by further increasing the penetration path of the moisture and oxygen, as compared to the exemplary embodiment of FIGS. 1 to 3.

In addition, since the thickness and surface area of the absorption functional layer 220 may be increased at the edge of the second substrate 210, the absorption functional layer 220 may further efficiently absorb the moisture and oxygen that penetrate in a surface direction from the side of the organic light emitting diode (OLED) display 400.

As described above, since the organic light emitting diode (OLED) display 400 of the exemplary embodiment of FIG. 2 may implement a multi barrier function by using the adhesive layer 230, the insulation pattern layer 240 and the absorption functional layer 220 in respects to the moisture and oxygen that penetrate in the surface direction at the side thereof, the organic light emitting diode (OLED) display 400 may further improve a sealing function in respects to the display portion 150.

Figure 5:
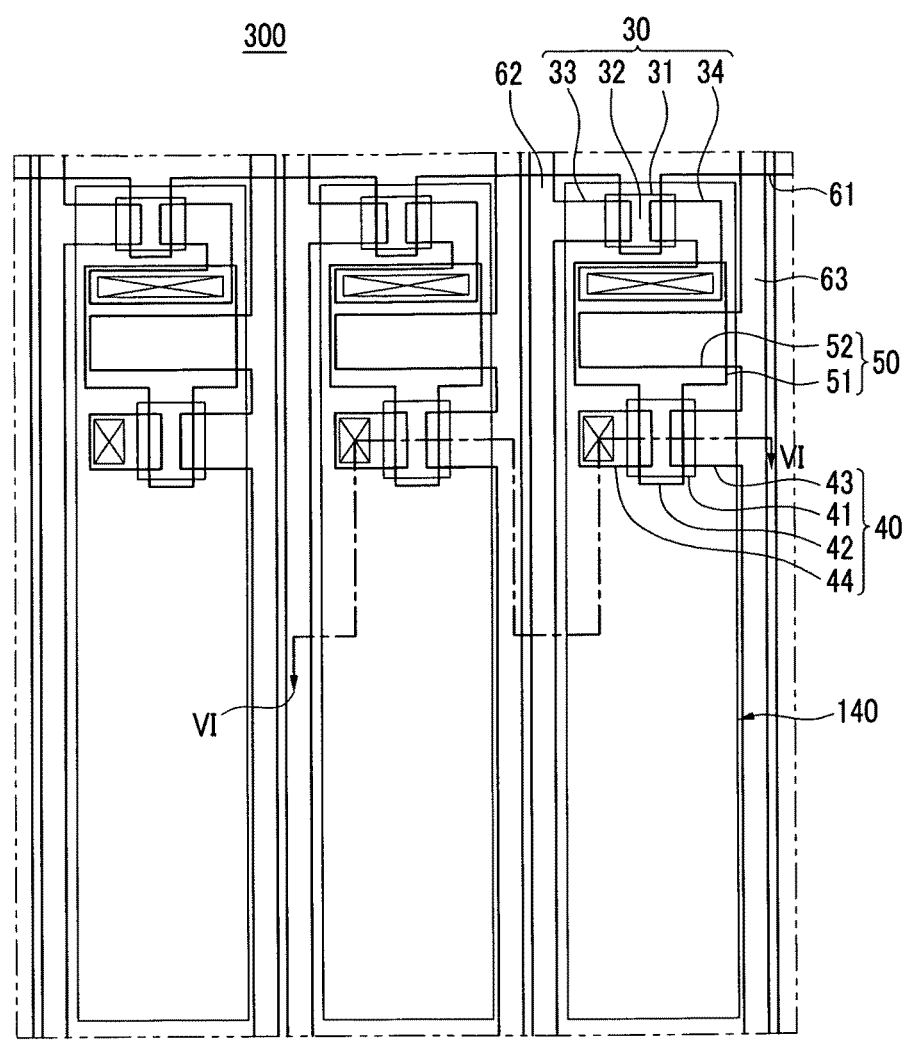
FIG. 5 illustrates a layout view of a display portion of the organic light emitting diode (OLED) display of FIG. 1.
Figure 6:
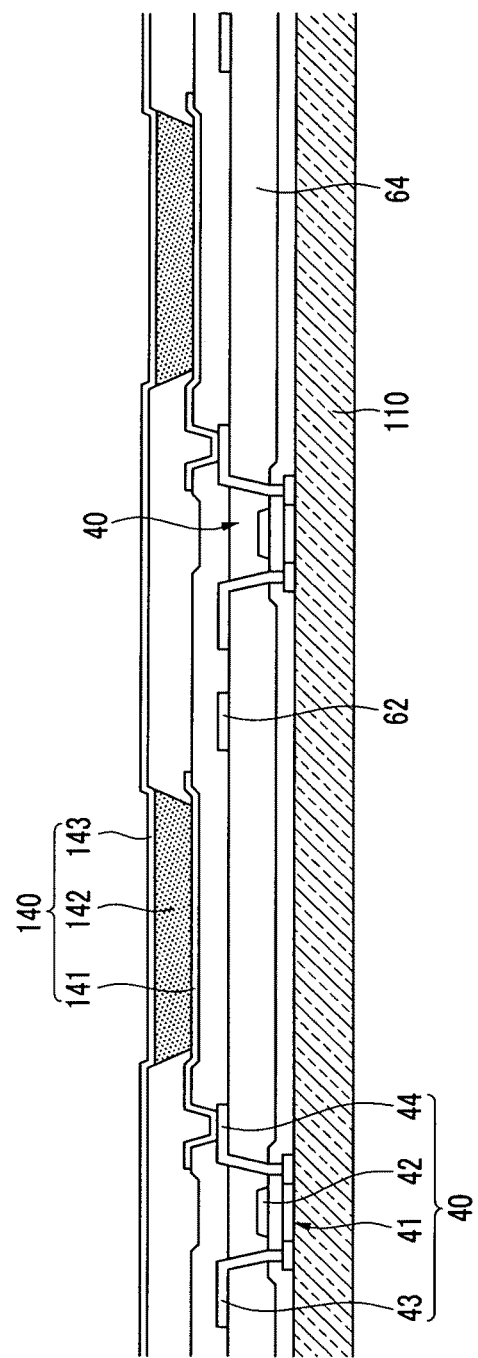
FIG. 6 illustrates a cross-sectional view that is taken along the line VI-VI of FIG. 5.

FIG. 5 illustrates a layout view of a display portion of the organic light emitting diode (OLED) display of FIG. 1, and FIG. 6 illustrates a cross-sectional view that is taken along the line II-II of FIG. 5. The structure of the display portion that will be described below is an example but the organic light emitting diode (OLED) display of the exemplary embodiments is not limited to the following structure.

Referring to FIG. 5 and FIG. 6, the organic light emitting diode (OLED) display 300 may include a switching thin film transistor 30 that is formed for each pixel, a driving thin film transistor 40, a capacitor 50 and an organic light emitting diode 140. The organic light emitting diode (OLED) display 300 further may include a gate line 61 that is disposed according to one direction, a data line 62 that crosses the gate line 61 in an insulation state, and a common power line 63.

The organic light emitting diode 140 may include a pixel electrode 141, an organic emission layer 142 and a common electrode 143. The pixel electrode 141 may be a hole injection electrode (anode electrode), and the common electrode 143 may be an electron injection electrode (cathode electrode). The organic emission layer 142 may be configured to include a hole injection layer HIL, hole transport layer HTL, emission layer, electron transport layer ETL and electron injection layer EIL that may be sequentially layered from the pixel electrode 141. At least one of these layers, except for the emission layer, may be omitted.

The holes and electrons may be injected from the pixel electrode 141 and common electrode 143 to the organic emission layer 142 to combine to form an exciton. When the exciton formed from the combination of the injected hole and electron falls from an exited state to a bottom state, light emission may be produced.

The pixel electrode 141 may be formed of a light-permissive conductive layer, and the common electrode 143 may be formed of a light-reflective conductive layer. Light that is emitted from the organic emission layer 142 may be reflected by the common electrode 143 and discharged outside through the pixel electrode 141 and the first substrate 110. This light emitting structure is called a rear side light emitting type. The pixel electrode 141 may include at least one of ITO, IZO, $In_2O_3$ and ZnO, and the common electrode 143 may include at least one of silver Ag, aluminum Al, silver alloy and aluminum alloy.

The capacitor element 50 may include a first capacitor plate 51 and a second capacitor plate 52 that may be disposed between interlayer insulating layers 64. The interlayer insulating layer 64 may be formed of a dielectric material. The capacitance is determined by the charge that is accumulated in the capacitor 50 and the voltage between the first and the second capacitors 51 and 52.

The switching thin film transistor 30 may include a switching semiconductor layer 31, a switching gate electrode 32, a switching source electrode 33 and a switching drain electrode 34. The driving thin film transistor 40 may include a driving semiconductor layer 41, a driving gate electrode 42, a driving source electrode 33 and a driving drain electrode 44.

The switching thin film transistor 30 may be a switching element that selects the pixel that emits light. The switching gate electrode 32 may be connected to the gate line 61. The switching source electrode 33 may be connected to the data line 62. The switching drain electrode 34 may be separated from the switching source electrode 33 and may be connected to the first capacitor plate 51.

The driving thin film transistor 40 may apply the driving voltage for performing light emission of the organic emission layer 142 of the selected pixel to the pixel electrode 141. The driving gate electrode 42 may be connected to the first capacitor plate 51, and the driving source electrode 43 and the second capacitor plate 52 may be connected to the common power line 63. The driving drain electrode 44 may be connected to the pixel electrode 141 of the organic light emitting diode 140 through the contact hole.

By the above structure, the switching thin film transistor 30 may be operated by the scan voltage that is applied to the gate line 61 and transfers the data voltage that is applied to the data line 62 to the driving thin film transistor 40. The voltage that corresponds to a difference in the common voltage that is applied from the common power line 63 to the driving thin film transistor 40 and the data voltage that is transferred from the switching thin film transistor 30 may be stored in the capacitor 50, and the current that corresponds to the voltage that is stored in the capacitor 50 may flow through the driving thin film transistor 40 to the organic light emitting diode 140 to allow the organic emission layer 142 to emit light.

A test cell of the exemplary embodiment and a test cell of Comparative Example may be manufactured. The comparison results of the life-span characteristics will be described. The test cells of the exemplary embodiment and Comparative Example may be a unicolored light emitting cell that includes a green organic emission layer that has a size of width 2 mm×length 2 mm. The test cell of Comparative Example may be formed as a structure where the adhesive layer and absorption functional layer and the second substrate are omitted from the test cell of the exemplary embodiment.

In the test cell of the exemplary embodiment, the adhesive layer may include an epoxy sealant and may be formed in a thickness of approximately 20 μm. The absorption functional layer may include potassium oxide and may be formed in a thickness of approximately 20 μm.

An accelerated life-span evaluation may be performed under an environment of high temperature and humidity (humidity of 90% at 60° C. or humidity of 85% at 85° C.) to obtain the degree of shrinkage occurrence of the pixel, and the life-span characteristic may be predicted on the basis of such results. That is, according to the structure for sealing the driving circuit portion and the organic light emitting diode, in consideration of the acceleration factors of the temperature and humidity, a real life-span may be predicted.

Figure 7:
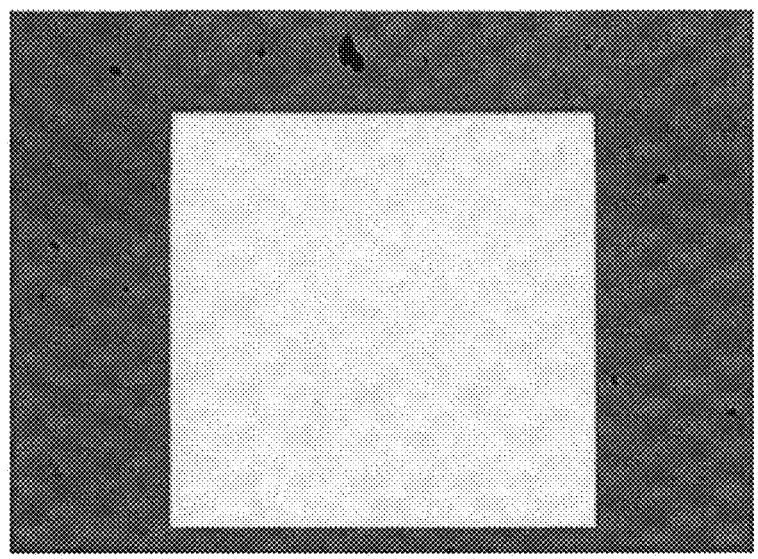
FIG. 7 illustrates the light emission of a test cell of an exemplary embodiment for evaluating the life-span.
Figure 8:
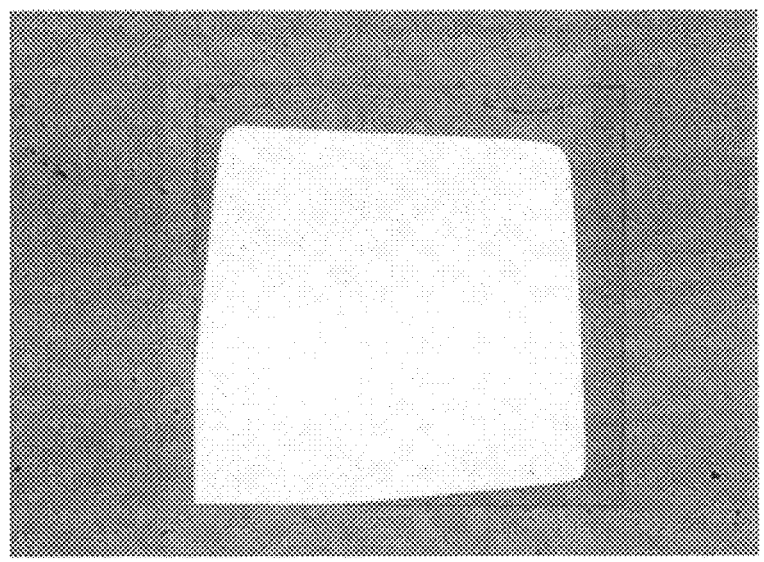
FIG. 8 illustrates the light emission of a test cell of a Comparative Example for evaluating the life-span.

FIG. 7 illustrates light emission of the test cell of the exemplary embodiment, and FIG. 8 illustrate light emission of the test cell of Comparative Example.

Referring to FIG. 7, it can be seen that under the condition of humidity of 85% at 85° C., the test cell of the exemplary embodiment that is observed after the driving for 1,000 hours does not cause the pixel shrinkage. On the other hand, referring to FIG. 8, under the same temperature and humidity condition, the test cell of Comparative Example that is observed after the driving for 1,000 hours exhibits pixel shrinkage at the level of several hundreds micrometers (μm). Accordingly, it can be confirmed that the test cell of the exemplary embodiment has excellent life-span characteristic in respects to the test cell of Comparative Example.

As a review, the context for the embodiments is a packaging or encapsulation technology to address the deterioration of an OLED by external factors such as penetration of external moisture, oxygen and ultraviolet radiation which in turn may cause defects in the OLED or reduce its life span. According to a thin film encapsulation technology, a display area of a substrate may be covered by a thin film encapsulation layer by alternately layering one or more layers of the inorganic and organic layers on the organic light emitting diodes. The thin film encapsulation layer may provide a slim organic light emitting diode (OLED) display that includes an ultra thin substrate and a flexible organic light emitting diode (OLED) display that includes a flexible film substrate.

The embodiments disclosed herein may circumvent a phenomenon in which the thin film encapsulation layer may only be effective to suppress penetration of moisture and oxygen according to a layering direction of the inorganic and organic layers, that is, a thickness direction, but may be ineffective to suppress the penetration of moisture and oxygen according to the surface direction of the thin film encapsulation layer at the edge of a display device. The embodiments may further avoid an increase in dead space (that is, a region in which a display is not implemented) due to an increase in the width of the thin film encapsulation layer outside the display area in an effort to increase the sealing performance and hence to increase the storage life-span.

The described technology provides an organic light emitting diode (OLED) display and a manufacturing method thereof, which may increase a storage life-span of the display by improving a sealing function of the organic light emitting diode without greatly increasing the dead space of the display.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display comprising:
   a first substrate;
   a display portion on the first substrate and including a driving circuit portion and an organic light emitting diode;
   a barrier layer between the first substrate and the display portion, the barrier layer covering less than an entire area of the first substrate and covering more than an entire area of the display portion;
   a thin film encapsulation layer that covers the display portion;
   an adhesive layer that contacts and covers an upper surface and a lateral side of the thin film encapsulation layer and that contacts and covers a lateral side of the barrier layer;
   an absorption functional layer on the adhesive layer, the absorption functional layer absorbing at least one of oxygen and moisture; and
   a second substrate on the absorption functional layer.

2. The organic light emitting diode (OLED) display as claimed in claim 1, wherein:
   the first substrate and the second substrate are made of a flexible polymer film.

3. The organic light emitting diode (OLED) display as claimed in claim 2, wherein:
   the first substrate is a transparent polymer film.

4. The organic light emitting diode (OLED) display as claimed in claim 1, wherein:
   the absorption functional layer includes at least one of a metal and a metal oxide.

5. The organic light emitting diode (OLED) display as claimed in claim 4, wherein:
   the absorption functional layer is formed on one side of the second substrate by sputtering.

6. The organic light emitting diode (OLED) display as claimed in claim 4, wherein:
   the absorption functional layer includes at least one of titanium, titanium alloy, titanium oxide, potassium, potassium oxide, magnesium, magnesium oxide, barium and barium oxide.

7. The organic light emitting diode (OLED) display as claimed in claim 4, wherein:
   the absorption functional layer has a smaller area than the adhesive layer, and the adhesive layer covers a side of the absorption functional layer.

8. The organic light emitting diode (OLED) display as claimed in claim 1, further including:
   an insulation pattern layer between the absorption functional layer and the second substrate.

9. The organic light emitting diode (OLED) display as claimed in claim 8, wherein:

the insulation pattern layer includes at least one opening at a portion of the insulation pattern layer that is adjacent to the edge of the second substrate, the absorption functional layer contacts the second substrate through the opening.

10. A method for manufacturing an organic light emitting diode (OLED) display, comprising:

forming a first substrate on a first support plate;

sequentially forming a barrier layer, a display portion that includes a driving circuit portion and an organic light emitting diode, and a thin film encapsulation layer that covers the display portion on the first substrate, the barrier layer covering less than an entire area of the substrate and covering more than an entire area of display portion;

forming a second substrate on a second support plate;

sequentially forming an absorption functional layer and an adhesive layer on the second substrate;

aligning and disposing the first support plate and the second support plate so that the adhesive layer and the thin film encapsulation layer face each other;

attaching the first support plate and the second support plate to each other so that the adhesive layer contacts and covers an upper surface of the thin film encapsulation layer and contacts and covers a lateral side of the barrier layer; and separating the first support plate from the first substrate and separating the second support plate from the second substrate.

11. The method as claimed in claim 10, wherein:

the first substrate is formed by coating a polymer resin on the first support plate, and the second substrate is formed by coating a polymer resin on the second support plate.

12. The method as claimed in claim 10, wherein:

the absorption functional layer includes at least one of a metal and a metal oxide and is formed on the second substrate by sputtering.

13. The method as claimed in claim 12, wherein:

the absorption functional layer includes at least one of titanium, titanium alloy, titanium oxide, potassium, potassium oxide, magnesium, magnesium oxide, barium and barium oxide.

14. The method as claimed in claim 10, wherein:

the adhesive layer has a larger area than the absorption functional layer and covers an upper portion and a side of the absorption functional layer.

15. The method as claimed in claim 10, wherein:

the adhesive layer has larger area than the thin film encapsulation layer and covers an upper portion and a side of the thin film encapsulation layer.

16. The method as claimed in claim 10, further comprising:

foaming an insulation pattern layer on the second substrate before forming the absorption functional layer on the second substrate.

17. The method as claimed in claim 16, wherein:

the insulation pattern layer includes at least one opening at a portion of the insulation pattern layer that is adjacent to the edge of the second substrate, the absorption functional layer contacts the second substrate through the opening.

* * * * *